United States Patent
Kasuya et al.

(10) Patent No.: US 9,263,418 B2
(45) Date of Patent: Feb. 16, 2016

(54) SEMICONDUCTOR DEVICE AND MANUFACTURING METHOD THEREOF

(71) Applicant: Kabushiki Kaisha Toshiba, Minato-ku (JP)

(72) Inventors: Nobutaka Kasuya, Yokkaichi (JP); Junichi Saijo, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/484,474

(22) Filed: Sep. 12, 2014

(65) Prior Publication Data
US 2015/0262969 A1 Sep. 17, 2015

(30) Foreign Application Priority Data
Mar. 12, 2014 (JP) .................. 2014-049386

(51) Int. Cl.
*H01L 21/44* (2006.01)
*H01L 23/00* (2006.01)
*H01L 29/40* (2006.01)

(52) U.S. Cl.
CPC .............. *H01L 24/85* (2013.01); *H01L 24/49* (2013.01); *H01L 2224/4909* (2013.01); *H01L 2224/85345* (2013.01); *H01L 2224/85986* (2013.01)

(58) Field of Classification Search
CPC ............ H01L 24/85; H01L 2224/4909; H01L 2224/85345; H01L 2224/85986
USPC .................................. 257/777, 784; 438/617
See application file for complete search history.

(56) References Cited

U.S. PATENT DOCUMENTS

| 6,774,494 | B2 | 8/2004 | Arakawa |
| 7,821,140 | B2 | 10/2010 | Mii et al. |
| 2007/0029367 | A1 | 2/2007 | Mii |
| 2009/0321927 | A1* | 12/2009 | Nishimura et al. . H01L 23/3128 257/737 |
| 2010/0237480 | A1* | 9/2010 | Mii et al. .......... H01L 23/49517 257/676 |

FOREIGN PATENT DOCUMENTS

| JP | 2002-280414 | 9/2002 |
| JP | 2005-159267 | 6/2005 |
| JP | 2009-76783 | 4/2009 |

* cited by examiner

*Primary Examiner* — Long K Tran
(74) *Attorney, Agent, or Firm* — Oblon, McClelland, Maier & Neustadt, L.L.P.

(57) ABSTRACT

According to one embodiment, a semiconductor device includes a first loop and a second loop. A folded-back portion is a portion formed by stretching out the first loop from a first bond in a first direction and then folding it back in a second direction. The folded-back portion is in a shape in which it is squashed against the first bond. The second loop is bonded to the folded-back portion. An end of the second loop is located at a second position. The second position is offset in a direction in which the first loop extends, from a first position. The first position is the center of the first bond of the first loop.

11 Claims, 7 Drawing Sheets

SEMICONDUCTOR DEVICE AND MANUFACTURING METHOD THEREOF

CROSS-REFERENCE TO RELATED APPLICATIONS

This application is based upon and claims the benefit of priority from Japanese Patent Application No. 2014-49386, filed on Mar. 12, 2014; the entire contents of which are incorporated herein by reference.

FIELD

Embodiments described herein relate generally to a semiconductor device and a manufacturing method thereof.

BACKGROUND

There is known a wire bonding method in the production process of a semiconductor device having a plurality of semiconductor elements laid one over another on a substrate, which sequentially connects electrode pads of each semiconductor element and lead electrodes of the substrate by wires. In this method, in order to secure bonding strength of the wire to an electrode pad, a bump may be formed on the electrode pad beforehand, and a wire leading from another electrode pad may be bonded to the bump. In addition to the bonding step of passing out wire to bond, the step of making bumps is needed, resulting in the number of steps for wire bonding being increased. In the case of forming bumps beforehand, the process time becomes longer, and also it costs more because the consumption of material increases.

As a method of reducing the number of steps for wire bonding by omitting the formation of bumps on electrode pads, for example, a method is disclosed wherein a fold of wire is formed at the neck portion of a ball bond instead of forming bumps and wherein a wire leading from another electrode pad is bonded to the fold. In the case of performing wire bonding by this method, it is required that enough bonding strength of the wire at the connection can be secured.

DETAILED DESCRIPTION

In general, according to one embodiment, a semiconductor device includes a substrate, a first semiconductor element, a second semiconductor element, a first loop, and a second loop. The substrate has a connection. The first semiconductor element has a first electrode. The second semiconductor element has a second electrode. The first loop links the connection and a first bond. The first bond is formed on the first electrode. The second loop links the first bond and a second bond. The second bond is formed on the second electrode. The first loop has a folded-back portion. The folded-back portion is formed by stretching out the first loop from the first bond in a first direction and then folding it back in a second direction. The second direction is different from the first direction. The folded-back portion is in a shape in which it is squashed against the first bond. The second loop is bonded to the folded-back portion. An end of the second loop is located at a second position. The second position is offset in a direction in which the first loop extends, from a first position. The first position is the center of the first bond of the first loop.

Exemplary embodiments of a semiconductor device and a manufacturing method thereof will be explained below in detail with reference to the accompanying drawings. The present invention is not limited to the following embodiments.

Embodiment

Figure 1:
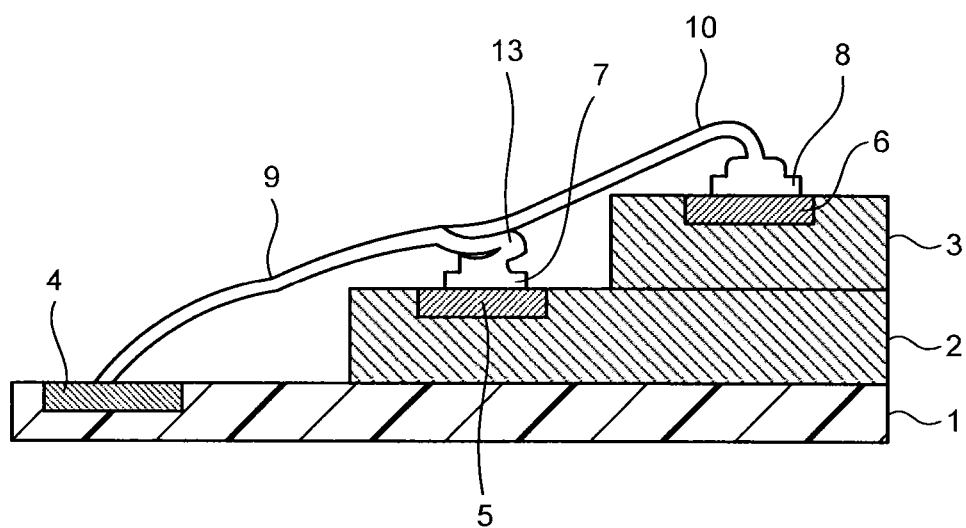
FIG. 1 is a diagram showing schematically the configuration of a semiconductor device according to an embodiment.
Figure 2:
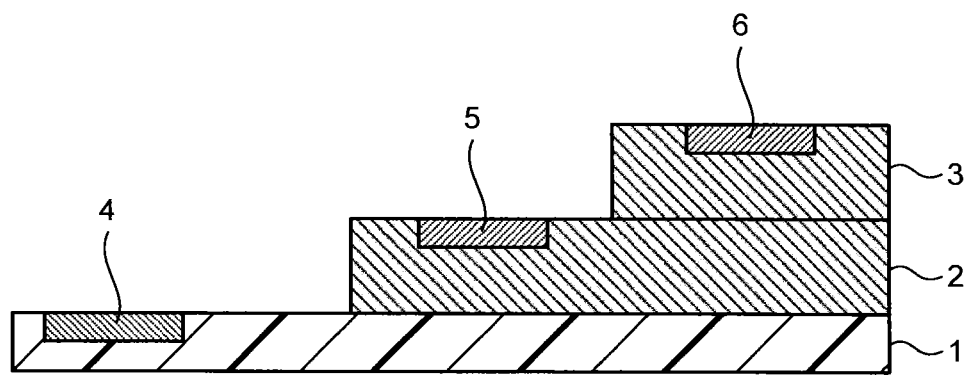
FIGS. 2 to 8 are diagrams explaining the wire bonding process in the production process of the semiconductor device.

FIG. 1 is a diagram showing schematically the configuration of a semiconductor device according to the embodiment. The semiconductor device has a layered structure in which two semiconductor elements 2, 3 are laid one over the other on a substrate 1.

The substrate 1 that is a circuit substrate comprises a lead finger 4 that is a connection. The semiconductor element 2 that is a first semiconductor element is provided on the other part of the substrate 1 than the area where the lead finger 4 is provided. The semiconductor element 2 comprises an electrode pad 5 that is a first electrode. There is a level difference corresponding to the thickness of the semiconductor element 2 between the lead finger 4 and the electrode pad 5 along a height direction that is in the direction along which the semiconductor elements 2, 3 are laid one over the other on the substrate 1.

The semiconductor element 3 that is a second semiconductor element is provided on the other part of the semiconductor element 2 than the area where the electrode pad 5 is provided. The semiconductor element 3 comprises an electrode pad 6 that is a second electrode. There is a level difference corresponding to the thickness of the semiconductor element 3 between the electrode pad 5 and the electrode pad 6 along the height direction.

A ball bond 7 that is a first bond is formed on the electrode pad 5. A loop wire 9 that is a first loop links the lead finger 4 and the ball bond 7. The loop wire 9 connected to the ball bond 7 on the electrode pad 5 extends obliquely downward to the lead finger 4.

A ball bond 8 that is a second bond is formed on the electrode pad 6. A loop wire 10 that is a second loop links the connection between the ball bond 7 and the loop wire 9, and the ball bond 8. The loop wire 10 connected to the ball bond 8 on the electrode pad 6 extends obliquely downward to the ball bond 7 on the electrode pad 5. The ball bonds 7, 8 and the loop wires 9, 10 are all formed of the same material such as gold.

A folded-back portion 13 is formed at the connection with the ball bond 7 of the loop wire 9. The folded-back portion 13 is formed by stretching the loop wire 9 out from the ball bond 7 in a first direction and then folding it back in a second direction. The first direction is in a direction parallel to the surface of the substrate 1 on which the semiconductor element 2 is provided and going from the position of the electrode pad 5 toward the position of the electrode pad 6. In FIG. 1, the first direction is in the direction from left toward right. The second direction is different from the first direction, for example, opposite to the first direction. The second direction is in a horizontal direction which goes from the electrode pad 5 toward the lead finger 4, that is, in the direction from right toward left in FIG. 1.

FIGS. 2 to 8 are diagrams explaining the wire bonding process in the production process of the semiconductor device. FIGS. 2 to 8 and FIG. 1 cited above show the ball bonds 7, 8, the loop wires 9, 10, a wire 12 in side view and the other components in cross-sectional view. In the step shown in FIG. 2, a layered structure is prepared in which the semiconductor elements 2, 3 have been sequentially laid over the substrate 1.

Figure 3:
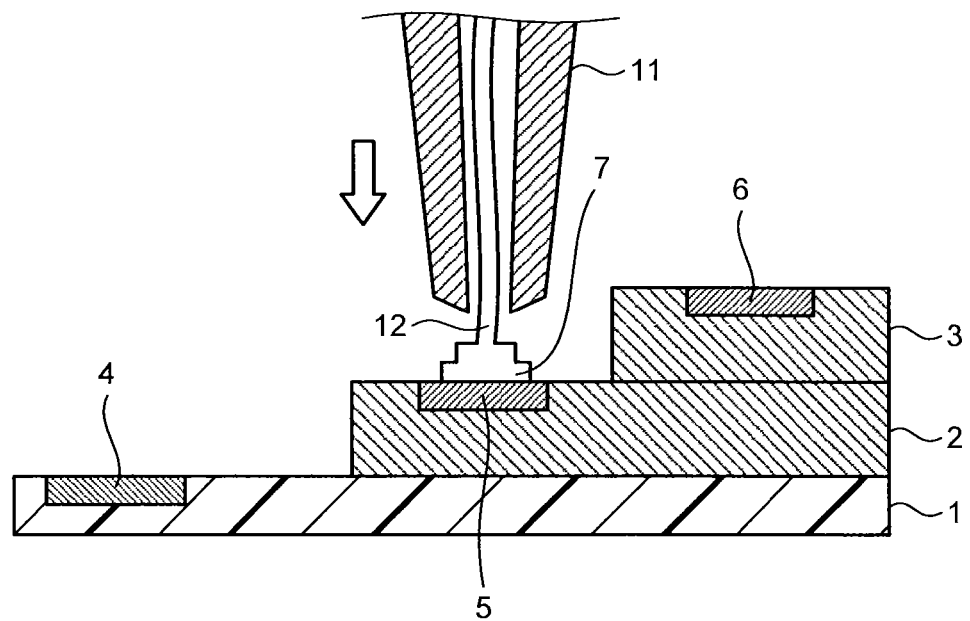

In the step shown in FIG. 3, the end of the wire 12 extending through a capillary 11, a bonding tool, is formed in a ball shape, and the ball-shaped portion is compression bonded to the electrode pad 5. The wire 12 is made of gold material. The end of the wire 12 is formed in a ball shape, and that portion compression-bonded to the electrode pad 5 is the ball bond 7. The wire 12 leads to the ball bond 7.

Figure 4:
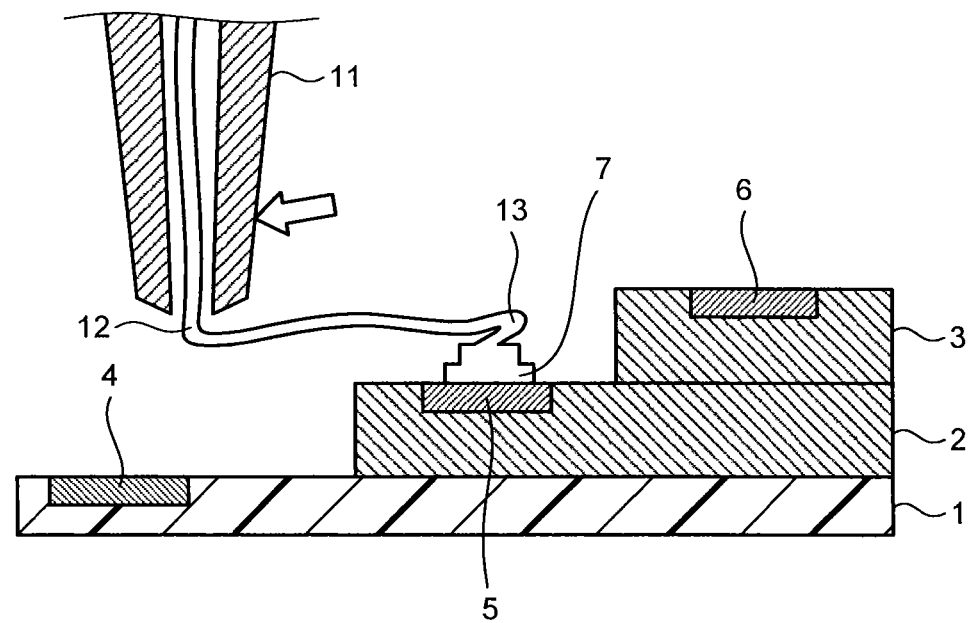

In the step shown in FIG. 4, a folded-back portion 13 is formed at the connection of the wire 12 with the ball bond 7. The folded-back portion 13 is formed by passing out the wire 12 to stretch from the neck portion of the ball bond 7 in a direction different from the second direction, e.g., in the first direction and then folding back the wire 12 in a direction different from the first direction, e.g., in the second direction. The folded-back portion 13 is in a shape in which, with a first position, that is, the center of the ball bond 7 as the center, it is squashed against the ball bond 7. The wire 12, after folded back in the second direction at the folded-back portion 13, is passed out to stretch toward the lead finger 4.

Figure 5:
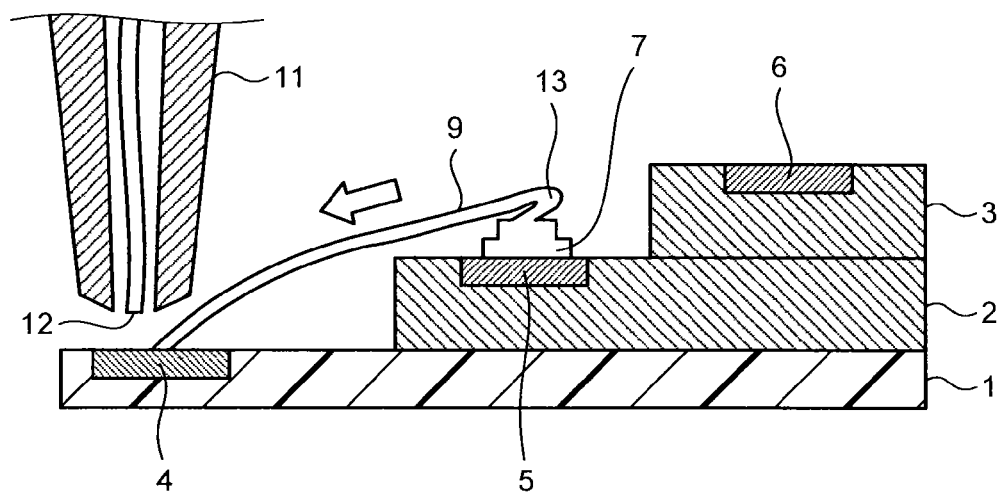

In the step shown in FIG. 5, the wire 12 is passed out to stretch obliquely downward, and the wire 12 is bonded to the lead finger 4. The wire 12 is bonded to the lead finger 4 by stitch bonding. The wire 12 is cut after bonding to the lead finger 4 finishes. By the steps shown in FIGS. 3 to 5, the loop wire 9 linking the lead finger 4 and the ball bond 7 is formed.

Figure 6:
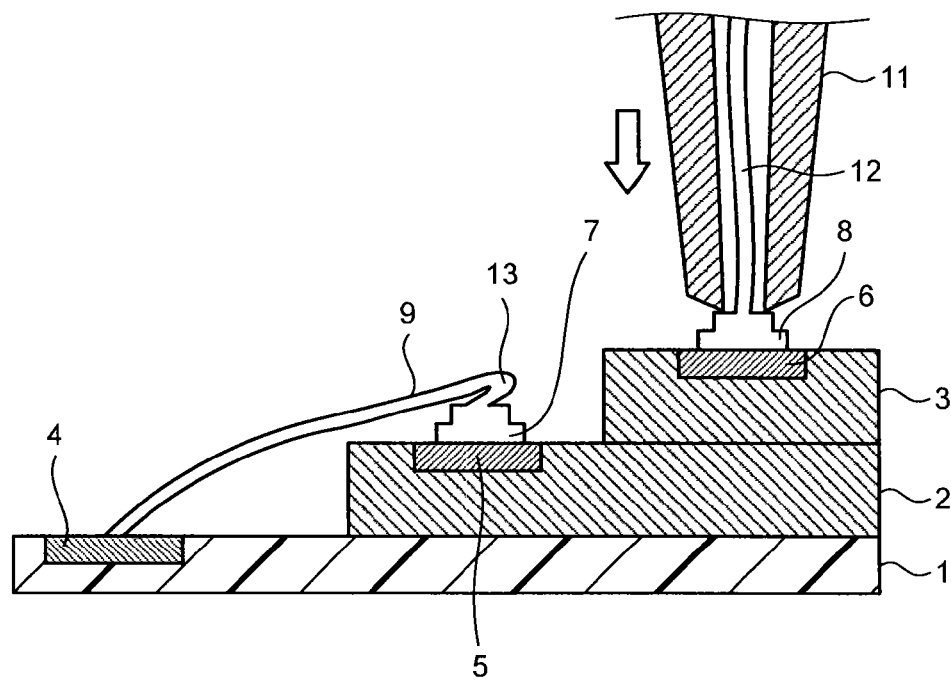

In the step shown in FIG. 6, the end of the wire 12 extending through the capillary 11 is formed in a ball shape, and the ball-shaped portion is compression bonded to the electrode pad 6. The end of the wire 12 is formed in a ball shape, and that portion compression-bonded to the electrode pad 6 is the ball bond 8. The wire 12 leads to the ball bond 8.

Figure 7:
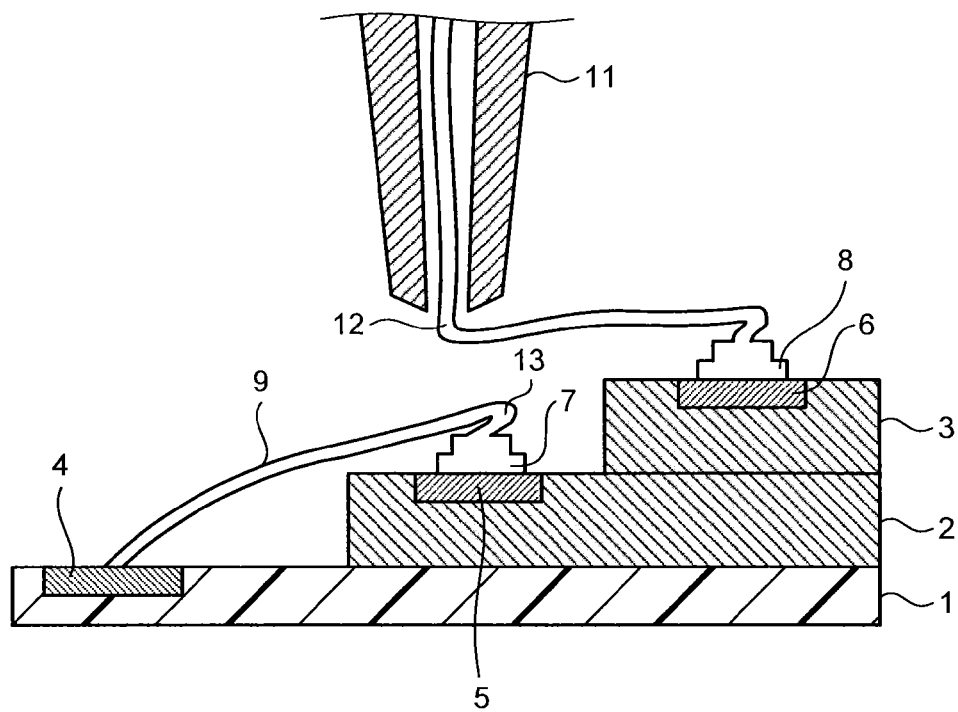
Figure 8:
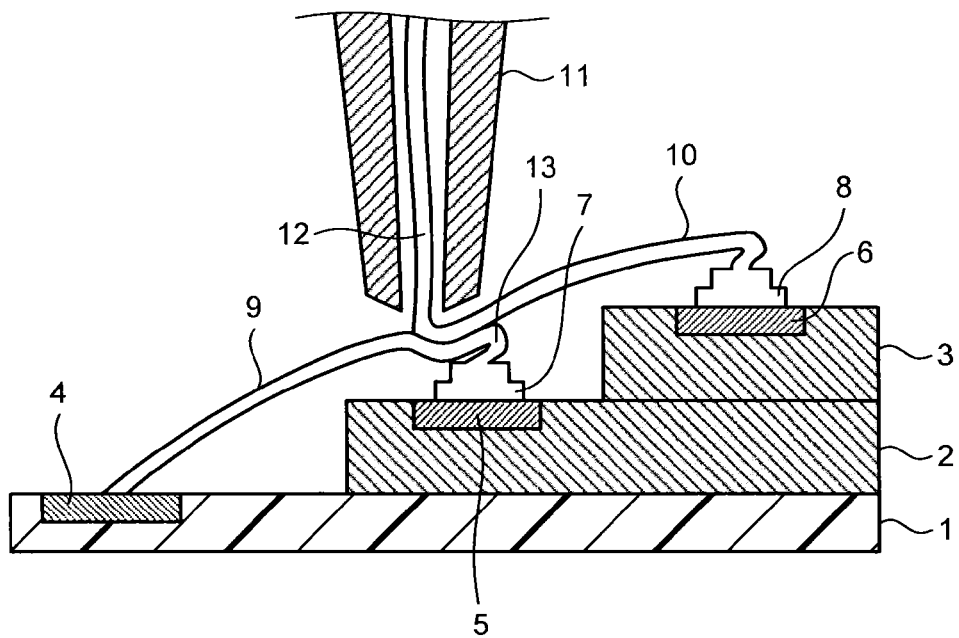

In the step shown in FIG. 7, the wire 12 is passed out to stretch from the ball bond 8 toward the folded-back portion 13. At this time, the wire 12 is passed out to stretch from the ball bond 8 in the direction of the electrode pad 5. In the step shown in FIG. 8, the wire 12 is passed out to stretch obliquely downward and is bonded to the folded-back portion 13. At this time, the end of the wire 12 is made to reach a second position of the loop wire 9, and the wire 12 and the loop wire 9 are bonded together.

The second position is offset in the second direction from the first position that is the center of the ball bond 7. The wire 12 is cut after bonding to the loop wire 9 finishes. By the steps shown in FIGS. 6 to 8, the loop wire 10 linking the ball bond 7 and the ball bond 8 is formed. Having undergone the above steps, wire bonding for the semiconductor device finishes.

In a conventional wire bonding method, for example, in order to secure the bonding strength of the loop wire 10 with the electrode pad 5, a bump may be formed on the electrode pad 5 beforehand. The bump is formed using the wire 12 as its material. The wire 12 passed out to stretch from the ball bond 8 on the electrode pad 6 is bonded to the bump by stitch bonding. A bump is formed each time electrodes are wired together as above.

The step of making a bump on the electrode pad 5 is needed which precedes the bonding step of passing out the wire 12 to bond. Since the formation of bumps is needed, the number of steps for wire bonding increases, and thus the processing time becomes longer. In the case of forming bumps beforehand, the processing time becomes longer, and the consumption of the wire 12 increases, and thus it costs more.

In the manufacturing method according to the present embodiment, the folded-back portion 13 is formed instead of a bump, and the wire 12 passed out to stretch from the ball bond 8 is bonded to the folded-back portion 13. By this means, the step of forming a bump on the electrode pad 5 can be omitted. By omitting the step of forming a bump, it becomes possible to shorten the processing time and reduce consumption of the wire 12, thus reducing cost. Because the number of steps can be reduced, in the production process of the semiconductor device, the frequency of failure occurrences can be reduced, thus improving yield.

Figure 9:
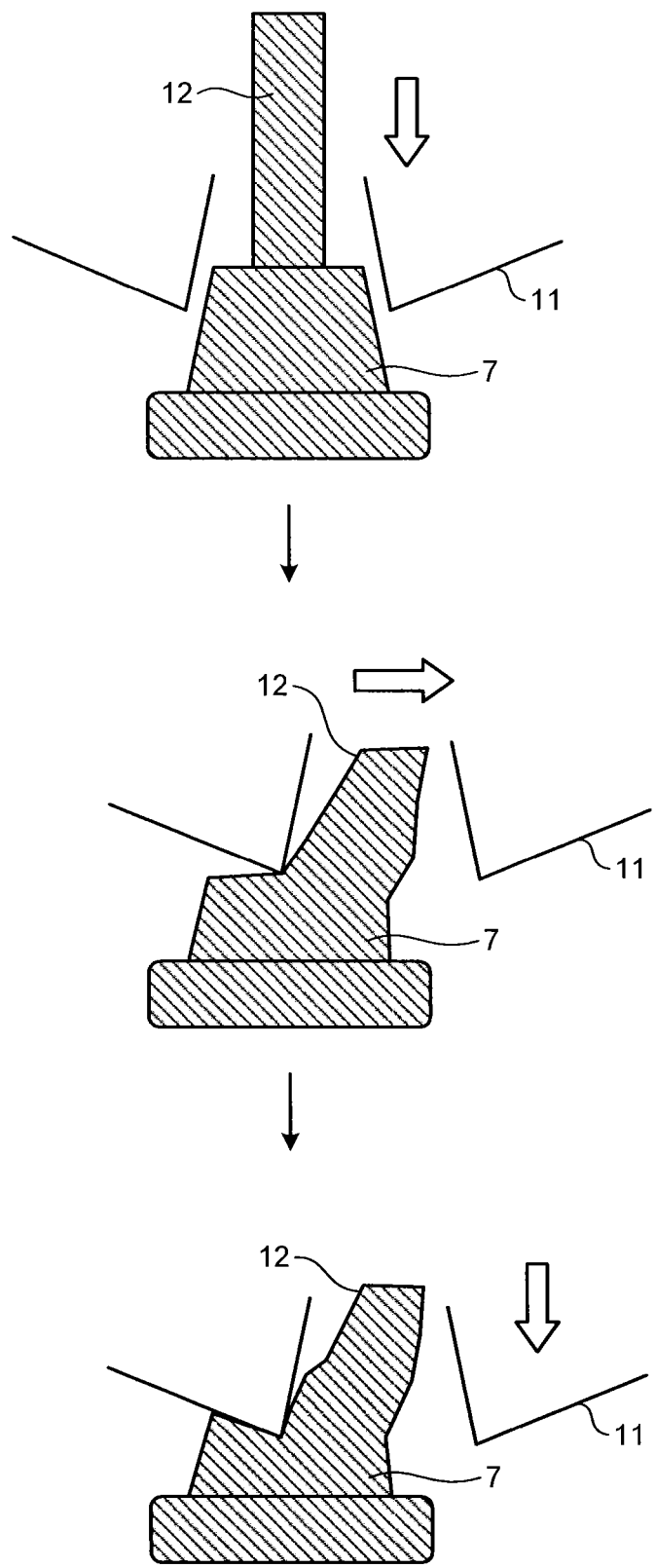
FIGS. 9 and 10 are diagrams showing the step of forming a folded-back portion in detail.
Figure 10:
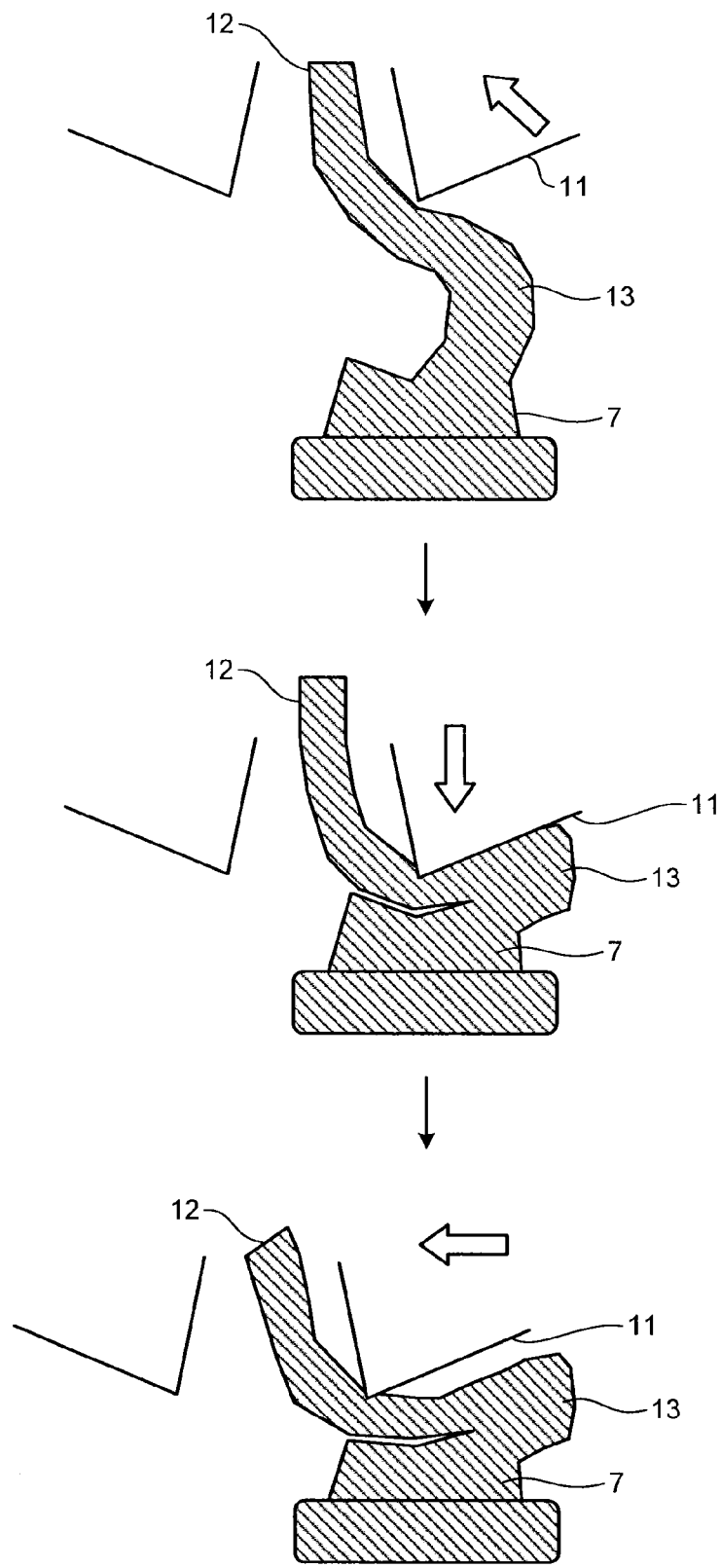

FIGS. 9 and 10 are diagrams showing the step of forming the folded-back portion in detail. FIGS. 9 and 10 show the ball bond 7 and the wire 12 in cross-sectional view. The shape of the tip of the capillary 11 in that cross section is indicated as lines.

In the step shown in the upper part of FIG. 9, the ball-shaped portion formed at the end of the wire 12 is squashed by the capillary 11 against the electrode pad 5. By this means, the ball bond 7 compression-bonded to the electrode pad 5 is formed.

In the step shown in the middle part of FIG. 9, starting from the wire 12 not being passed out through the capillary 11 as shown in the upper part of FIG. 9, the capillary 11 is moved in the first direction. The tip of the capillary 11 presses the side of the neck portion of the ball bond 7 in the first direction, which portion is the upper end connecting to the wire 12. The neck portion is pressed in the first direction to deform as if it is pushed aside in the first direction.

The capillary 11 deforms the neck portion to such a degree that its tip touching the ball bond 7 arrives near the center position of the ball bond 7. At this time, the wire 12 inside the capillary 11, including the neck portion, is bent in the first direction by this pressing. The wire 12 gets in a state where it stretches from the ball bond 7 in the first direction.

Subsequently, in the step shown in the lower part of FIG. 9, the capillary 11 is pushed down from being in the state shown in the middle part of FIG. 9, so as to further deform the neck portion. In the step shown in the upper part of FIG. 10, after the capillary 11 is slightly moved vertically upward, the capillary 11 is moved in an oblique upward direction leaning in the second direction. As such, by passing out the wire 12 while moving the capillary 11, part of the wire 12 lower than the capillary 11 stretches in the first direction and then is folded back in the second direction. This folded-back portion is the folded-back portion 13 before being squashed.

The capillary 11 is lowered toward the ball bond 7 from being in the state where the tip of the capillary 11 touches the wire 12 near a position directly above the center position of the ball bond 7 as shown in the upper part of FIG. 10. In the step shown in the middle part of FIG. 10, after the wire 12 pushed down by the capillary 11 touches the neck portion of the ball bond 7, the capillary 11 is further pushed down. In this step, the folded-back part of the wire 12 is pressed down against the ball bond 7 to form the folded-back portion 13 having a shape in which it is squashed with the first position, that is, the center of the ball bond 7 as the center.

In the step shown in the lower part of FIG. 10, the capillary 11 is moved in the second direction from being in the state shown in the middle part of FIG. 10. The capillary 11, passing out the wire 12, moves toward the lead finger 4, in the second direction subsequent to this.

Figure 11:
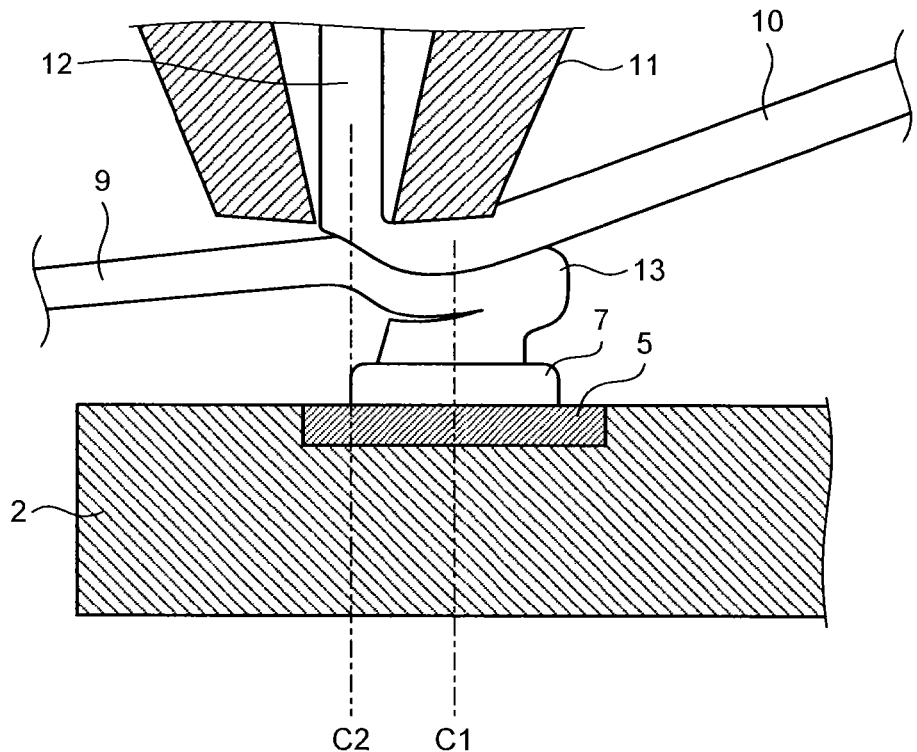
FIG. 11 is a diagram showing the state when wire is bonded to the folded-back portion.

FIG. 11 shows the state when the wire is bonded to the folded-back portion. FIG. 11 shows the components in cross-sectional view. Hatching is omitted from the ball bond 7, the loop wires 9, 10, and the wire 12 in the figure.

The capillary 11 traveling in the second direction from the ball bond 8 on the electrode pad 6 arrives directly above the folded-back portion 13 and further moves in the second direction until the center of the capillary 11 coincides with a second position C2. The wire 12 is passed out until reaching the second position C2. The second position C2 is offset in the second direction from the first position C1 that is the center of the ball bond 7.

The wire 12 is passed out until reaching the second position C2, and then the capillary 11 is lowered toward the ball bond 7. By pushing down the wire 12 by the capillary 11, the wire 12 is compression bonded to the folded-back portion 13. The wire 12 is cut at the second position C2 after bonding to the loop wire 9 finishes. The loop wire 10 is bonded to a part of the loop wire 9 from the end of the folded-back portion 13 to the second position C2.

Figure 12:
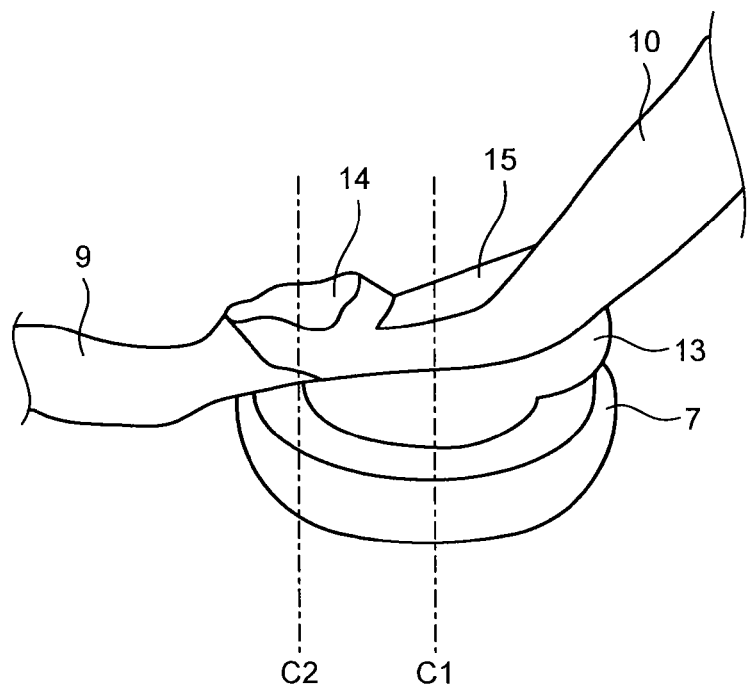
FIG. 12 is a perspective view showing the appearance of the connection of loop wires on a ball bond.

FIG. 12 is a perspective view showing the appearance of the connection of the loop wires on the ball bond. The end cut surface 14 of the loop wire 10 is formed by cutting the wire 12. The end cut surface 14 is formed to have the second position C2 as its center. An indentation 15 is formed in the upper surface on the side opposite to the side bonded to the folded-back portion 13 of the loop wire 10. The indentation 15 is formed by the capillary 11 being pressed against the wire 12 when the wire 12 is compression bonded to the folded-back portion 13.

The indentation 15 is formed in the vicinity of the first position C1. The end cut surface 14 is located at a position in the direction in which the loop wire 9 extends from the first position C1, for example, the second direction from the indentation 15. Note that the folded-back portion 13 may not be identified in appearance because the folded-back portion 13, together with the loop wire 10, is squashed against the ball bond 7.

According to the embodiment, in the production process of the semiconductor device, the number of steps in wire bonding can be reduced by omitting the step of forming a bump. The wire 12 is passed out until the capillary 11 reaches the second position C2 offset in the second direction from the center position C1, and the wire 12 is bonded to the folded-back portion 13, and thus for the part of the loop wire 10 bonded to the loop wire 9, enough area can be secured. In the semiconductor device, enough strength of bonding with the loop wire 10 at the ball bond 7 on the electrode pad 5 can be secured. Thus, the semiconductor device can be manufactured with a smaller number of steps, and the effect of securing enough bonding strength of wires at bonds can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method of a semiconductor device comprising:

passing out wire to stretch in a first direction from a first bond formed on a first electrode and then folding back the wire in a second direction different from the first direction;

pressing down the folded-back wire against the first bond to form a folded-back portion in a shape in which it is squashed;

bonding the wire passed out to stretch from the folded-back portion, to a connection of a substrate so as to form a first loop linking the connection and the first bond; and bonding wire passed out to stretch from a second bond formed on a second electrode, to the folded-back portion so as to form a second loop linking the first bond and the second bond, wherein in forming the second loop, an end of the wire is bonded to the first loop at a second position offset in a direction in which the first loop extends, from a first position that is the center of the first bond.

2. The manufacturing method of the semiconductor device according to claim 1, wherein the second direction is opposite to the first direction.

3. The manufacturing method of the semiconductor device according to claim 1, wherein after the first bond is formed using an end of wire, the folded-back portion and the first loop are formed using the wire leading to the first bond.

4. The manufacturing method of the semiconductor device according to claim 1, wherein in forming the second loop, the wire is bonded to a part of the first loop that has a range from an end of the folded-back portion to the second position.

5. The manufacturing method of the semiconductor device according to claim 1, wherein the first direction is in a direction from the position of the first electrode toward the position of the second electrode.

6. The manufacturing method of the semiconductor device according to claim 1, wherein the second direction is in a direction from the position of the first electrode toward the position of the connection.

7. The manufacturing method of the semiconductor device according to claim 1, wherein the second position is offset in the second direction from the first position.

8. The manufacturing method of the semiconductor device according to claim 1, wherein the wire is passed out through a capillary, and wherein in stretching out the wire from the first bond in the first direction, the side of a neck portion connecting to the wire of the first bond is pressed in the first direction by the tip of the capillary.

9. The manufacturing method of the semiconductor device according to claim 1, wherein the wire is passed out through a capillary, and wherein in forming the folded-back portion, the tip of the capillary is made to touch the wire, and the capillary is pushed down toward the first bond.

10. The manufacturing method of the semiconductor device according to claim 1, wherein the wire is passed out through a capillary, and wherein in forming the second loop, the wire is passed out until the capillary reaches the second position, and then the capillary is pushed down toward the first bond, thereby compression bonding the wire to the folded-back portion.

11. The manufacturing method of the semiconductor device according to claim 1, wherein the first electrode is formed in a first semiconductor element laid on the other part of the substrate than its area where the connection is provided, and wherein the second electrode is formed in a second semiconductor element laid on the other part of the first semiconductor element than its area where the first electrode is provided.

* * * * *